US007352568B2

(12) United States Patent
Ishida et al.

(10) Patent No.: US 7,352,568 B2
(45) Date of Patent: Apr. 1, 2008

(54) ELECTRONIC APPARATUS AND IMAGE FORMING APPARATUS COMPRISING SUCH ELECTRONIC APPARATUS

(75) Inventors: Kazuhito Ishida, Ichinomiya (JP); Takamitsu Kawai, Obu (JP); Teruo Deshimaru, Nagoya (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 0 days.

(21) Appl. No.: 11/534,658

(22) Filed: Sep. 24, 2006

(65) Prior Publication Data

US 2007/0080957 A1 Apr. 12, 2007

(30) Foreign Application Priority Data

Sep. 26, 2005 (JP) .............................. 2005277314

(51) Int. Cl.
*H05K 5/00* (2006.01)

(52) U.S. Cl. ....................... 361/683; 345/204; 455/556

(58) Field of Classification Search ................ 248/157, 248/920; 345/1.1, 87, 204, 213; 455/556, 455/557.1; 361/679–682, 724–727

See application file for complete search history.

(56) References Cited

U.S. PATENT DOCUMENTS

| | | | | |
|---|---|---|---|---|
| 6,781,821 | B2 * | 8/2004 | Tsubai | 361/681 |
| 7,137,676 | B2 * | 11/2006 | Sugimoto et al. | 312/7.2 |
| 2005/0144819 | A1 * | 7/2005 | Shimizu et al. | 40/491 |
| 2007/0228232 | A1 * | 10/2007 | Ikeno et al. | 248/157 |

FOREIGN PATENT DOCUMENTS

| | | | |
|---|---|---|---|
| JP | 1995041078 | U | 7/1995 |
| JP | 1995217642 | A | 8/1995 |
| JP | 2000227763 | A | 8/2000 |
| JP | 2002100883 | A | 4/2002 |
| JP | 2004053768 | A | 2/2004 |

* cited by examiner

*Primary Examiner*—Hung Van Duong
(74) *Attorney, Agent, or Firm*—Baker Botts L.L.P.

(57) ABSTRACT

An electronic apparatus includes a main body; a display portion, a responsive member and a frictional sliding member. The display portion is supported by the main body rotatably about an axis of a rotary shaft so as to extend and retract with respect to the main body. The responsive member reciprocates in a guide groove formed in the main body as a result of the extension and retraction of the display portion. The responsive member includes a first end rotatably attached to a rear side of the display portion at a position offset from the axis of the rotary shaft, and a second end including with an engagement piece engaged with the guide groove. The frictional sliding member is disposed along the guide groove and, when compressed by the engagement piece of the responsive member, the frictional sliding member applies a frictional force to the reciprocating responsive member. An image forming apparatus may include such an electronic apparatus.

20 Claims, 14 Drawing Sheets

ELECTRONIC APPARATUS AND IMAGE FORMING APPARATUS COMPRISING SUCH ELECTRONIC APPARATUS

BACKGROUND OF THE INVENTION

This application claims the benefit of Japanese Patent Application No. 2005-277314, filed on Sep. 26, 2005, which is incorporated herein by reference.

1. Field of the Invention

The present invention relates to electronic apparatus which comprise a tilt mechanism for maintaining an extendable, display portion at a desired position relative to a main body of the electronic apparatus. The invention also relates to image forming apparatus comprising such electronic apparatus. More particularly, the invention relates to an uncomplicated and relatively inexpensive means for achieving a tilt mechanism for maintaining a display portion, provided extendably, at a desired position with respect to the main body of the electronic apparatus.

2. Description of Related Art

Printers, scanners, copy machines, telephones, facsimile machines, and similar devices have been provided with electronic apparatus, each having a display portion with a liquid crystal panel or the like. For example, when employing such an electronic apparatus as an operation panel with a display portion, the operation panel may be disposed on the upper surface of the device, to facilitate the operability of the operations keys and the visibility of the display portion.

Liquid crystal panels frequently are used in such display portions. Generally, with liquid crystal panels, the viewing angle is narrow, and the contrast and color saturation may decrease when the panel is viewed from a diagonal direction. The above-described operation panel is operated from an upper surface of the device or is operated from a front side of the device. Accordingly, if the display portion is parallel to the upper surface of the device, visibility is reduced from the front side of the device, and, on the other hand, if the display portion is parallel to the front side of the device, visibility is reduced from the upper surface of the device. To address this problem, it has been proposed to provide a display portion which is extendable with respect to the operation panel, such that the position of the display panel of the display portion may be changed arbitrarily to be parallel to the upper surface of the device or to the front side of the device. Such an electronic apparatus is equipped with a tilt mechanism which maintains the display portion in an arbitrary position.

A rotary damper has been employed as the tilt mechanism disposed at the rotating part of the display portion, such as in Japanese Unexamined Utility Model Application Publication No. H07-041078. When the rotary damper is in contact with a rotating rotor inside an operational compartment formed in the device housing, oil compounded rubber is loaded into the operational compartment, and the rotor is compressed against the oil compounded rubber by a biasing means. When the rotary shaft of the rotary damper rotates, frictional resistance develops between the rotor and the oil compounded rubber, and acts as torque control for the rotary shaft.

Another tilt damper mechanism has been proposed as a separate, tilt mechanism, such as that described in Japanese Unexamined Patent Application Publication No. H07-217642, wherein movable friction plates and fixed friction plates are inserted alternately into a shaft on the display portion side. The tilt damper mechanism then presses in the axial direction via a sliding plate between the friction plates.

Tilt mechanisms as described in Japanese Unexamined Patent Application Publication Nos. H07-041078 and H07-217642 are disposed at the display portion rotational fulcrum, namely, a display portion shaft supported by the device housing. The damper mechanism is a single unit assembled from a plurality of members in the axial direction. In order to provide such a unit at the display portion shaft, mounting space for the unit must be reserved in the vicinity of the shaft. Accordingly, if the display portion shaft is in the vicinity of the upper surface or front side of the device housing, the unit in which the damper mechanism is employed protrudes from the upper surface or front side of the device housing, the device housing is enlarged, and the appearance is undesirable.

Yet another configuration has been proposed as a separate, tilt mechanism, such as that described in Japanese Unexamined Patent Application Publication Nos. 2000-227763, 2002-100883, and 2004-053768, in which a disk-shaped member is provided on the side (i.e., rear side) of the display unit opposite the display and is compressed by a frictional elastic member disposed in the device housing.

In tilt mechanisms, such as those described in Japanese Unexamined Patent Application Publication Nos. 2000-227763, 2002-100883, and 2004-053768, a disk-shaped member centered on the display portion shaft is disposed on the rear side of the display portion, such that space is reserved to hold the disk-shaped member on the rear side of the display portion. In particular, because space is reserved in the device housing to hold the disk-shaped member protruding from the rear side of the display portion in a retracted position, it is difficult to reduce the thickness of the device housing.

In addition, in known tilt mechanisms, although frictional resistance is generated by pressing the elastic member against the rotary display portion and against the rotating member as torque for controlling the rotation of the display portion, the number of components and assembly man-hours for such elastic members and the like increase.

SUMMARY OF THE INVENTION

Thus, a need has arisen to provide an uncomplicated and relatively low-cost means for implementing a tilt mechanism for maintaining an extendable display portion at a desired position relative to the main body of an electronic apparatus.

In an embodiment of the invention, the electronic apparatus comprises a main body, a display portion, a responsive member, and a frictional sliding member. The display portion is supported by the main body rotatably about an axis of a rotary shaft so as to extend and retract with respect to the main body. The responsive member reciprocates in a guide groove formed in the main body as a result of the extension and retraction of the display portion. The responsive member comprises a first end rotatably attached to a rear side of the display portion at a position offset from the axis of the rotary shaft, and a second end comprising an engagement piece engaged with the guide groove. The frictional sliding member is disposed along the guide groove and, when compressed by the engagement piece of the responsive member, the frictional sliding member applies a frictional force to the reciprocating responsive member.

When rotating about the axis of the rotary shaft, the display portion extends and retracts with respect to the main body. The responsive member rotatably attached at a rear side of the display portion and offset from the axis of the rotary shaft rotates with the display portion. The engagement piece disposed at the second end of the responsive member is engaged so as to slide freely within the guide groove of the main body. Thus, when the first end of the responsive member rotates, the second end reciprocates in the guide groove. The frictional sliding member is provided along this guide groove. The frictional sliding member is compressed against the engagement piece sliding in the guide groove. Frictional force is generated when the engagement piece slides due to the compression of the frictional sliding member. As a result of this frictional force, frictional resistance is applied to the reciprocation of the responsive member, and frictional resistance is generated in the rotation of the display portion through the responsive member. The tilt mechanism for maintaining the display portion in a desired retracted position is thereby achieved.

The frictional sliding member also may be formed to increase the compression force applied to the engagement piece as the responsive member moves along with the retraction of the display portion.

As the display portion retracts, the engagement piece of the responsive member slides along the guide groove in the direction away from the axis of the display portion's rotary shaft. As the display portion retracts, a greater frictional resistance may be used to hold said display portion in the desired position. The frictional sliding member increase the compression force applied to the engagement piece as the responsive member moves along with the retraction of the display portion. Accordingly, if the display portion is retracted to a certain degree, the display portion may maintain that position. Additionally, as the display portion retracts, the rotational friction generated in the display portion may be held constant to improve the operational feel.

The frictional sliding member is suitably implemented with the groove width of the guide groove narrowing toward the direction in which the responsive member moves as the display portion retracts.

An elastically deformable material, compressed against the engagement piece, is suitable as the frictional sliding member.

An operation key for inputting a desired instruction may be provided adjacent to the guide groove, and the elastically deformable key member constituting the operation key and the frictional sliding member may be formed integrally. Thus, the frictional sliding member may be implemented at a reduced cost. Additionally, the frictional sliding member and the operation key may be assembled together to reduce the manufacturing cost.

A locking member with a plurality of locking claws arrayed in a circumferential direction around the axis of the rotary shaft is provided at the main body, and an elastic member with a tip bent to be locked between the adjacent locking claws is provided, protruding from the display portion so as to compress against said locking member. The display portion may be maintained in a desired position when the tip of the elastic member is locked between the locking claws of the locking member.

When the display portion is retracted, the tip of the elastic member moves between the locking claws of the locking member. Because the tip of the elastic member is compressed against the locking member, the tip elastically deforms when the tip moves from between the current locking claws to between the next locking claws and is restored to its original shape between the locking claws when the tip locks between those locking claws. Because the elastic deformation and restoration of this elastic member takes place sequentially as the display portion rotates, a clicking sensation may be provided by the rotation of the display portion. Because the elastic deformation convergently settles as the elastic member is restored after elastic deformation, minute movements in the direction of rotation are transmitted to the display portion. As a result, although minute reciprocations are transmitted to the responsive member, frictional force is applied to the reciprocations of the responsive member by the frictional sliding member, so as to inhibit minute reciprocations of the responsive member. Minute rotations of the display portion also are inhibited thereby, and a desirable clicking sensation is achieved without minute vibrations.

In this manner, according to the electronic apparatus of the present invention, the responsive member rotatably attached at a rear side of the display portion and offset from the axis of the rotary shaft rotates with the display portion, and the engagement piece provided at the second end of the responsive member is engaged with the guide groove of the main body and slides while compressed against the frictional sliding member to generate a frictional force. Frictional resistance due to the frictional force is applied to the reciprocation of the responsive member, and the tilt mechanism for maintaining the display portion in a desired retracted position is achieved, so that the electronic apparatus may be made thinner with a uncomplicated configuration near the axis of the rotary shaft of the display portion. In addition, by applying the frictional force to the engagement piece of the responsive member at a position offset from the axis of the rotary shaft of the display portion, the frictional force for implementing the tilt mechanism may be reduced, and abrasion and noise generated by the frictional sliding member may be reduced or eliminated. Further, by forming the frictional sliding member with silicon rubber or a similarly elastic material and by forming the adjacent operation key integrally, the number of components may be reduced, and the assembly man-hours may be reduced, thereby decreasing the manufacturing cost.

In an embodiment of the invention, an image forming apparatus comprises a printer and an electronic apparatus. The electronic apparatus comprises a main body, a display portion, a responsive member, and a frictional sliding member. The display portion is supported by the main body rotatably about an axis of a rotary shaft so as to extend and retract with respect to the main body. The responsive member reciprocates in a guide groove formed in the main body as a result of the extension and retraction of the display portion. The responsive member comprises a first end rotatably attached to a rear side of the display portion at a position offset from the axis of the rotary shaft, and a second end comprising an engagement piece engaged with the guide groove. The frictional sliding member is disposed along the guide groove and, when compressed by the engagement piece of the responsive member, the frictional sliding member applies a frictional force to the reciprocating responsive member. The image forming apparatus further may comprise an operation key disposed adjacent to the guide groove for inputting a desired instruction, wherein an elastic key member comprising the operation key and the frictional sliding member are formed integrally. The image forming apparatus still further may comprise a slot portion configured to receive a storage media and to extract image data from the storage media to be printed by a printer or to be displayed by the display portion, or both.

Further objects, features, and advantages of the present invention will be understood from the following detailed description of preferred embodiments of the present invention with reference to the accompanying figures.

BRIEF DESCRIPTION OF THE DRAWINGS

Embodiments of the invention now are described with reference to the accompanying figures, which are given by way of example only, and are not intended to limit the invention.

For a more complete understanding of the invention, the needs satisfied thereby, and the objects, features, and advantages thereof, reference now is made to the following description taken in connection with the accompanying drawings.

DETAILED DESCRIPTION OF EMBODIMENTS

Embodiments of the invention are described below with appropriate reference to the drawings. These embodiments are merely examples of the invention.

Figure 1:
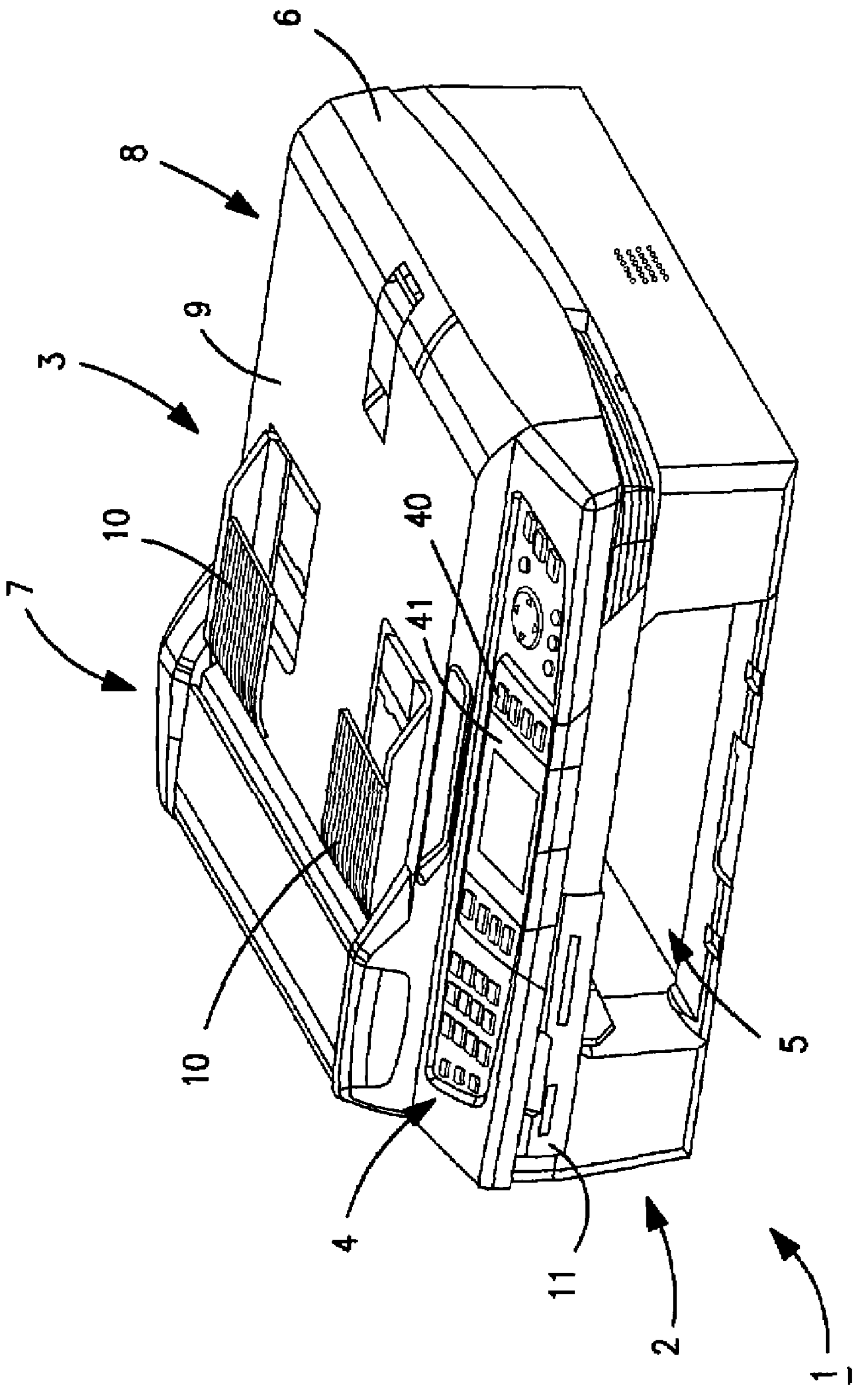
FIG. 1 is a perspective view showing the external configuration of a multi-function device according to an embodiment of the present invention.

FIG. 1 shows the external configuration of a multi-function device 1 according to an embodiment of the invention. Multi-function device 1 integrates a printer portion 2 in the lower portion and a scanner portion 3 in the upper portion, and has a printer function, a scanner function, a copier function, and a facsimile function.

Multi-function device 1 preferably is connected to a computer (not shown) and records images and documents on a recording medium based on image data and document data received, for example, from the computer. In addition, multi-function device 1 may be connected to an external device, such as a digital camera, to record image data output from the external device on a recording medium, or to store image data onto a storage medium, such as a memory card, so that image data or the like stored thereon later may be recorded on recording medium.

An operation panel 4 is disposed on the upper surface on the front side of multi-function device 1. Operation panel 4 includes various operation keys 40 and a liquid crystal display portion 41. A user may input a desired instruction using operation panel 4. Multi-function device 1 receives a predetermined input and carries out a predetermined operation. In addition to instructions input to operation panel 4, multi-function device 1 also may be connected to a computer to operate in response to instructions transmitted via a printer driver, scanner driver, or the like, from the computer. Operation panel 4 corresponds to the electronic apparatus according to an embodiment of the invention, and the device housing forming operation panel 4 corresponds to the device housing of the electronic apparatus according to the present invention. Although the electronic apparatus according to the invention may comprise operation panel 4 of multi-function device 1 in this embodiment, the electronic apparatus is not limited to multi-function device 1, but also may comprise a printer, a scanner, a copy machine, a telephone, a facsimile machine, a computer, or the like.

An opening 5 may be formed in the front side of multi-function device 1. Recording media to be recorded with images by printer portion 2 is held in a media feed tray and is received by a media discharge tray, which are disposed in opening 5. In FIG. 1, multi-function device 1 is shown with the media feed tray and the media discharge tray removed. For example, printer portion 2 comprises an ink jet recording device, recording media held in the media feed tray is fed into a conveyance path, and image formation is carried out by discharging of ink drops from an ink jet recording head onto the recording medium. Because the detailed configuration of the printer portion 2 is not necessary to describing the present invention, a detailed description is omitted.

For scanner portion 3, a document cover 8 comprises an automatic document feeding mechanism (e.g., an automatic document feeder, referred to hereinafter as an "ADF") 7, which is attached to a document table 6 functioning as an flatbed scanner (FBS), so as to open and close freely via a rear-side hinge. Platen glass is disposed above document table 6; an image reader unit is disposed inside document table 6. When scanner portion 3 is used as an FBS, document cover 8 is opened, and a document may be placed onto the platen glass. Document image reading is carried out by the FBS by scanning the image reading unit along the platen glass.

ADF 7 feeds a document from a document tray 9 to a document discharge tray 10 through the conveyance path. In this conveyance process, the document passes over the platen glass reading surface, and the image reading unit reads the image from the document. During image reading by ADF 7 and scanner portion 3, document cover 8 is closed on document table 6. Because the detailed configuration of scanner portion 3 is not necessary to describing the present invention, a detailed description is omitted.

A slot portion 11 for loading various compact memory cards as storage media may be disposed in the upper left portion of the front of multi-function device 1. Image data recorded on the compact memory card loaded in slot portion 11 is read, information relating to that image data is displayed on liquid crystal display portion 41, and a selected image may be recorded on recording medium by printer portion 3. Input thereof is carried out with operation panel 4. Slot portion 11 is an optional feature in the invention.

Figure 2:
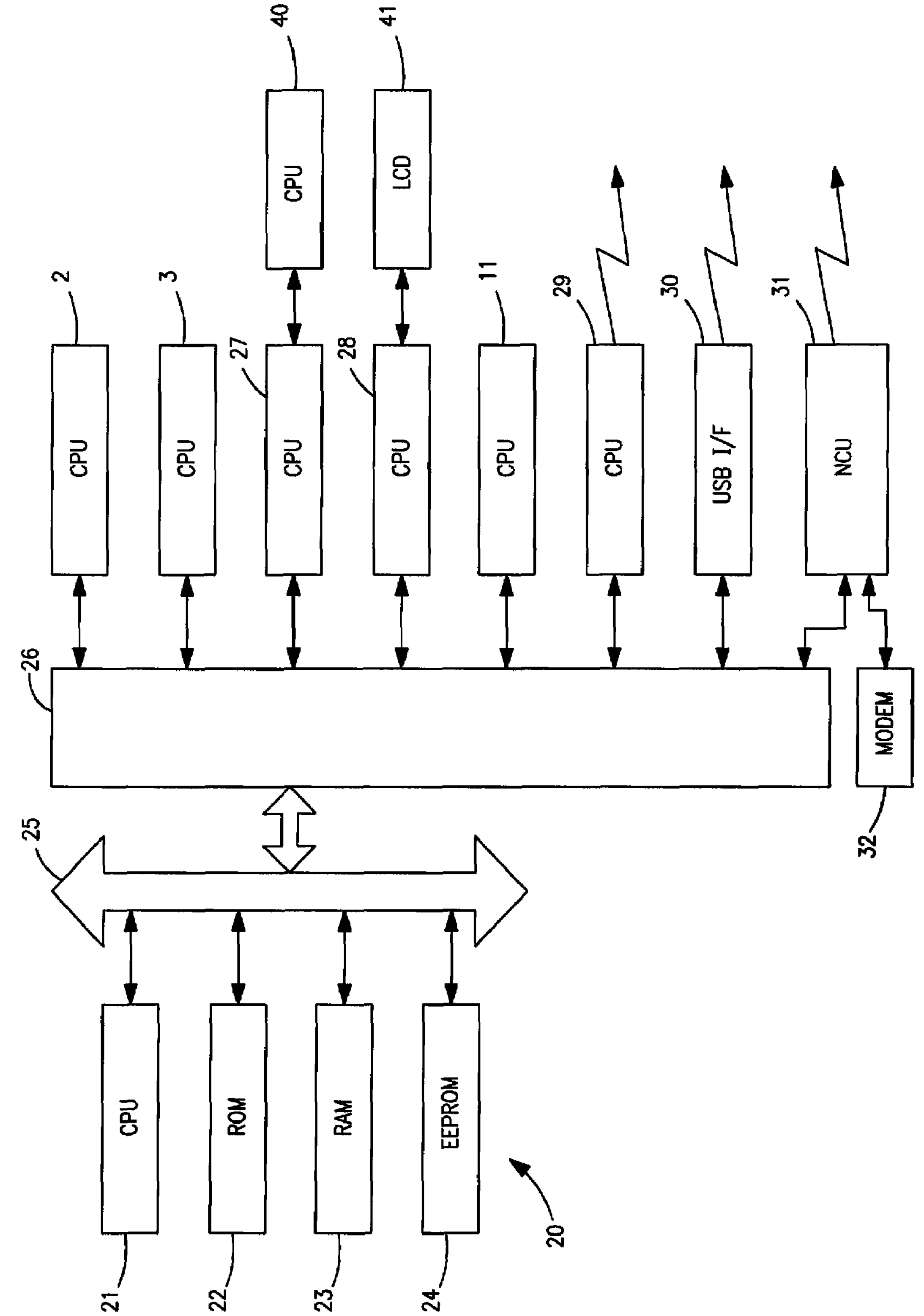
FIG. 2 is a block diagram showing the configuration of a control portion.

A control portion for controlling the operation of multi-function device 1 is described below. FIG. 2 shows the configuration of a control portion 20 of multi-function device 1. Control portion 20 controls the operation of multi-function device 1 including printer portion 2, scanner portion 3, and operation panel 4 (electronic apparatus). As shown in FIG. 2, control portion 20 may comprise a microcomputer consisting primarily of a central processing unit (CPU) 21, a read only memory (ROM) 22, a random access memory (RAM) 23, and an electrically erasable and programmable ROM (EEPROM) 24 connected to an application specific integrated circuit (ASIC) 26 via a bus 25.

Programs and the like for controlling the various operations of multi-function device 1 may be stored in ROM 22. RAM 23 and CPU 21 may be used as a workspace and a memory region for temporarily recording data used when CPU 21 executes the above-mentioned programs.

ASIC 26 carries out operational control of printer portion 2, scanner portion 3, operation panel 4, and slot portion 11, according to instructions from CPU 21. Although a detailed description is omitted because printer portion 2, scanner portion 3, and slot portion 11 are optional component features in the invention, operation of the motor for driving printer portion 2, the motor for driving the ink jet recording head, and ADF 7 of scanner portion 3, the image reading unit, and the like, may be controlled by control portion 20.

A panel gate array 27 for controlling operation keys 40 for inputting a desired instruction into multi-function device 1 is connected to ASIC 26. Panel gate array 27 detects depression of operation keys 40 and outputs a predetermined code signal. Key codes are assigned to correspond to the plurality of operation keys 40. After receiving a predetermined key code from panel gate array 27, CPU 21 carries out a control process that may be executed in accordance with a predetermined key processing table. The key processing table may be converted to a table to correspond to the key code and control processing and may be stored, for example, in ROM 22.

An LCD controller 28 for controlling the panel display of liquid crystal display portion 41 is connected to ASIC 26. Based on instructions from the CPU 21, LCD controller 28 displays information related to the operation of printer portion 2 and scanner portion 3 on the screen of liquid crystal display portion 41.

In addition, a parallel interface 29 and a Universal Service Bus (USB) interface 30 may be connected to ASIC 26 for exchanging data with the computer via a parallel cable or a USB cable. Further, a network control unit (NCU) 31 and a modem 32 for implementing the facsimile function are connected to ASIC 26.

Operation panel 4 of multi-function device 1 is described below. As shown in FIG. 1, operation panel 4 is provided on the front side of document table 6. Operation panel 4 comprises operation keys 40 and liquid crystal display portion 41. A user inputs a desired instruction using operation panel 4. Multi-function device 1 receives a predetermined input and carries out a predetermined operation. In addition to instructions input to operation panel 4, multi-function device 1 also may be connected to a computer to operate in response to instructions transmitted via a printer driver, scanner driver, or the like, from said computer.

Figure 3:
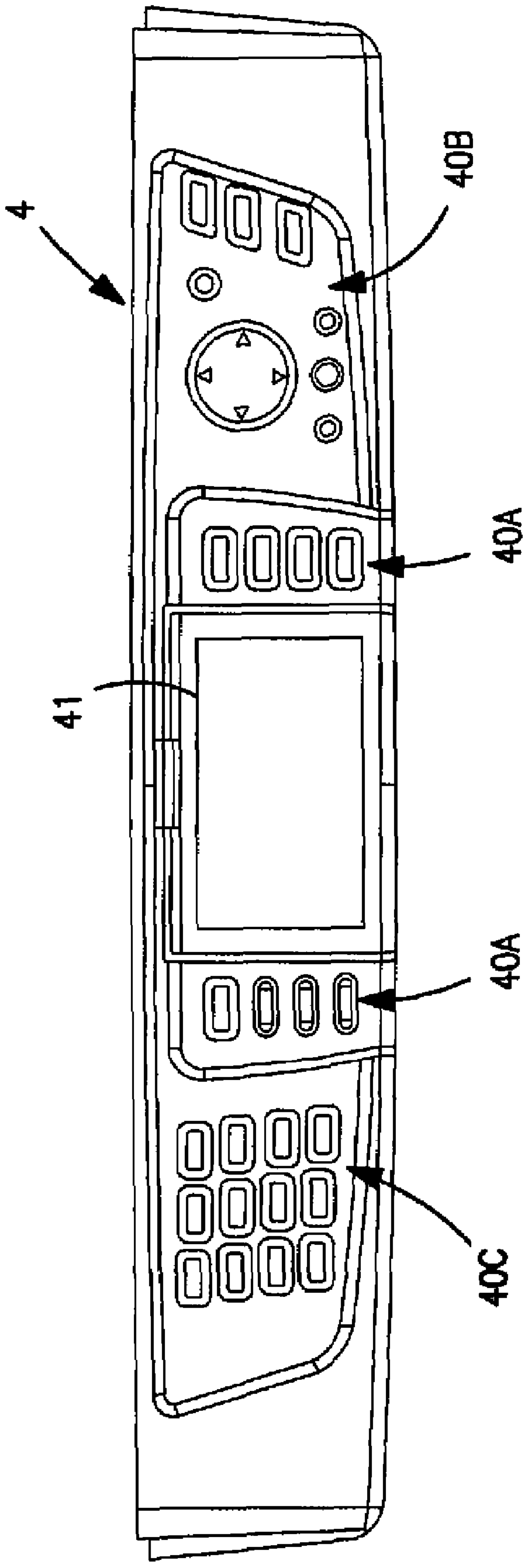
FIG. 3 is a partial plan view showing the configuration of an operation panel.

As shown in FIG. 3, the plan view of liquid crystal display portion 41 is a substantially horizontal rectangle, and the vertical dimension is slightly less than the depth of operation panel 4. Accordingly, there is no space for disposing operation keys 40 in operation panel 4 on the rear side or the front side of liquid crystal display portion 41. In other words, liquid crystal display portion 41 is increased to a size of operation panel 4 on which display portion 41 may be disposed. By maximizing size for liquid crystal display portion 41, the visibility of characters, images, and the like, displayed on the liquid crystal display portion 41 is improved.

Liquid crystal display portion 41 is disposed centered on the widest portion of operation panel 4. The width of liquid crystal display portion 41 is sufficiently less than the width of operation panel 4. Accordingly, there is space to dispose operation keys 40 in operation panel 4 at the sides of liquid crystal display portion 41. By disposing liquid crystal display portion 41 in the center of operation panel 4, operation keys 40 may be disposed on both the left and right sides of liquid crystal display portion 41. In this manner, the position of liquid crystal display portion 41 is better balanced in relation to the disposition of operation keys 40.

Operation keys 40 are divided into three groups: operation keys 40A provided at the periphery of liquid crystal display portion 41, operation keys 40B provided on the right side of operation panel 4, and operation keys 40C provided on the left side of operation panel 4.

Operation keys 40A are disposed at the periphery of liquid crystal display portion 41, in rows along the edges of liquid crystal display portion 41 on both the left and right sides. In this manner, the space on the sides of liquid crystal display portion 41 may be effectively utilized by disposing operation keys 40A at both the left and right sides of liquid crystal display portion 41.

Figure 4:
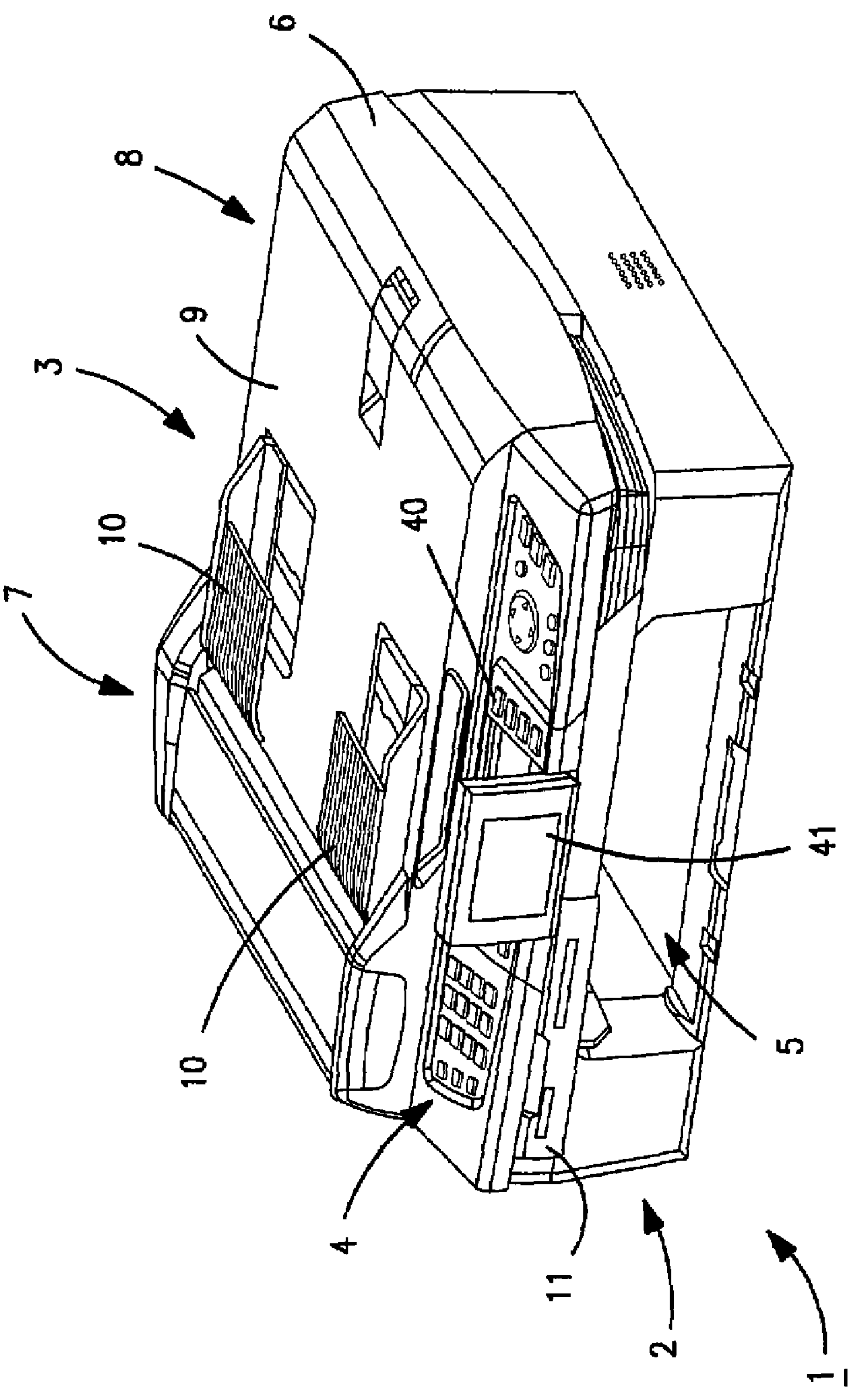
FIG. 4 is a perspective view showing the external configuration of the multi-function device of FIG. 1 with a liquid crystal display portion in a standing position.

As shown in FIG. 1, liquid crystal display portion 41 may be retracted against operation panel 4, such that the surface of the former and the surface of operation panel 4 form a single surface. This position of liquid crystal display portion 41 is the retracted position where display portion 41 faces upward. At the same time, liquid crystal display portion 41 is rotatable so as to stand up in relation to the surface of operation panel 4, as shown in FIG. 4. This position of liquid crystal display portion 41 is the standing position. With liquid crystal display portion 41 in the retracted position, liquid crystal display portion 41 does not project from the surface of operation panel 4, thereby improving the appearance of operation panel 4. In additional, the visibility of the display of liquid crystal display portion 41 from above multi-function device 1 is improved. At the same time, with liquid crystal display portion 41 in the standing position where display portion 41 faces frontward, the visibility of the display of liquid crystal display portion 41 from the front of multi-function device 1 is improved.

By means of the tilt mechanism, liquid crystal display portion 41 may be maintained at an intermediate position between the retracted position and the standing position. Accordingly, a user of multi-function device 1 may place the display of liquid crystal display portion 41 at an easiest-to-read position. The tilt mechanism of liquid crystal display portion 41 is described in detail below.

Figure 5:
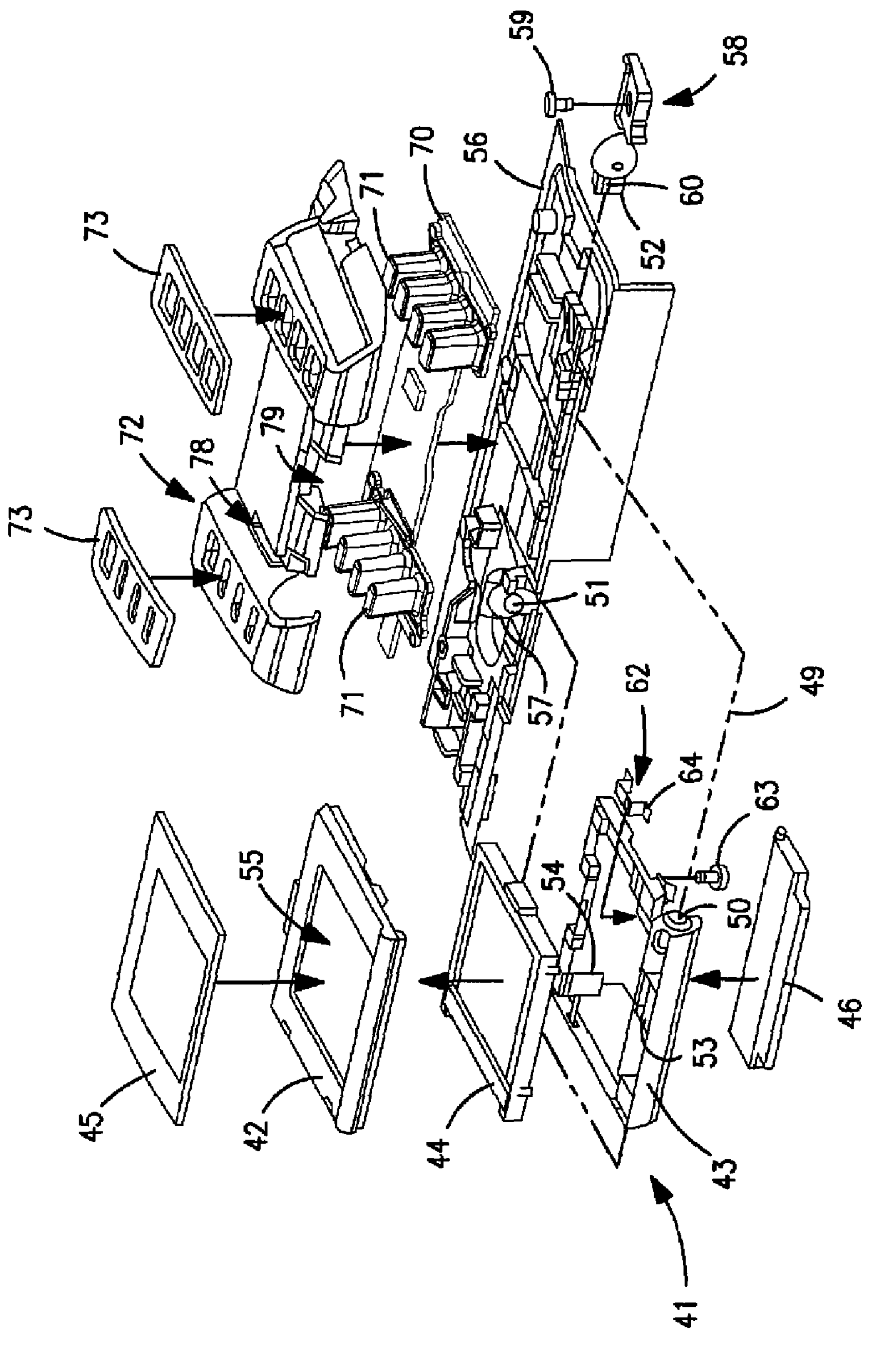
FIG. 5 is an exploded perspective view showing the configuration of the area around the liquid crystal display portion and operation keys.

FIG. 5 is an exploded perspective view of liquid crystal display portion 41 and its periphery. As shown in FIG. 5, liquid crystal display portion 41 includes an upper cover 42 and a lower cover 43, composing the housing for liquid crystal display portion 41; a liquid crystal display (LCD) module 44 provided with a backlight, a backlight plate, a diffusion sheet, and the like in one unit; and a transparent cover 45 for covering upper cover 42.

The plan view of lower cover 43 comprising the back and peripheral surfaces of liquid crystal display portion 41 has a substantially rectangular, bowl shape. A cylindrical shaft bearing 50 is formed at both ends of the device front side of lower cover 43. Shafts 51, 52 provided protruding in a substantially horizontal direction from the sides of operation panel 4 are inserted into shaft bearing 50, so that they are secured. Liquid crystal display portion 41 is supported on a base plate 56 of operation panel 4 rotatably about an axis 49 of a rotary shaft formed by shaft bearing 50 and shafts 51, 52. A through-hole 53 is formed towards the rear side, substantially centered on the device front side of lower cover 43. A flat cable 54 for electrically connecting LCD module 44 and the control board constituting control portion 20 disposed at the main body side of multi-function device 1 is inserted through through-hole 53. LCD controller 28 is mounted on the control board; LCD module 44 receives an electric signal from LCD controller 28, and a predetermined image is displayed on the panel of LCD module 44.

The plan view of upper cover 42 is rectangular and substantially corresponding to the plan view of lower cover 43. Upper cover 42 constitutes the front and peripheral surfaces of liquid crystal display portion 41. By assembling lower cover 43 with upper cover 42, a housing in a substantially rectangular, parallelepiped form is formed having an interior space capable of housing LCD module 44. An opening 55 corresponding to the panel of LCD module 44 is formed at the front of upper cover 42. Through opening 55, the panel of LCD module 44, housed in the interior space of the housing formed upper cover 42 and lower cover 43, is exposed.

The plan view of transparent cover 45 is rectangular and substantially corresponding to the plan view of upper cover 42. The region of transparent cover 45 corresponding to opening 55 of upper cover 42 may be made from transparent resin, and the surrounding region may be opaquely colored. The panel of LCD module 44, exposed by opening 55, is visible through the transparent region of transparent cover 45. The region around opening 55 of upper cover 42, namely the front surface, is covered by the opaque region of transparent cover 45.

Figure 6:
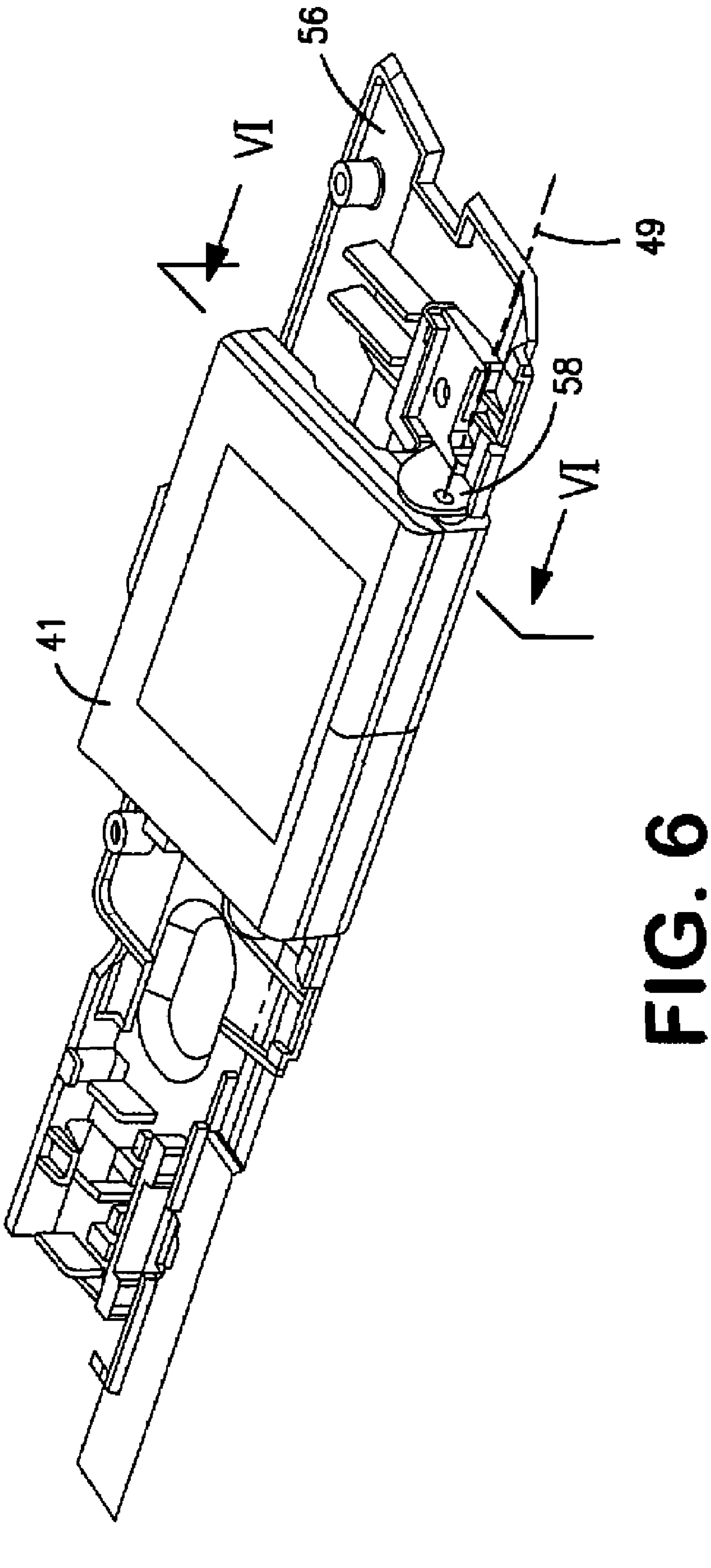
FIG. 6 is a partial perspective view showing the liquid crystal display portion attached to a base plate.

Shafts 51, 52 are fixed to base plate 56 of operation panel 4. Shaft 51 is formed integrally with a rib 57, extending vertically from base plate 56, and projects in a substantially horizontal direction. Shaft 52 is formed integrally with a shaft member 58, a separate member from base plate 56. Shaft member 58 is fixed to base plate 56 with a screw 59 or other fastener, and shafts 51, 52 constitute an opposing pair. When attaching liquid crystal display portion 41, one end of shaft bearing 50 of liquid crystal display portion 41 is secured to shaft 51, shaft 52 of shaft member 58 is secured to the other end of shaft bearing 50, and shaft member 58 is screwed to base plate 56. In this manner, liquid crystal display portion 41 is rotatably supported by base plate 56, as shown in FIG. 6.

Figure 7:
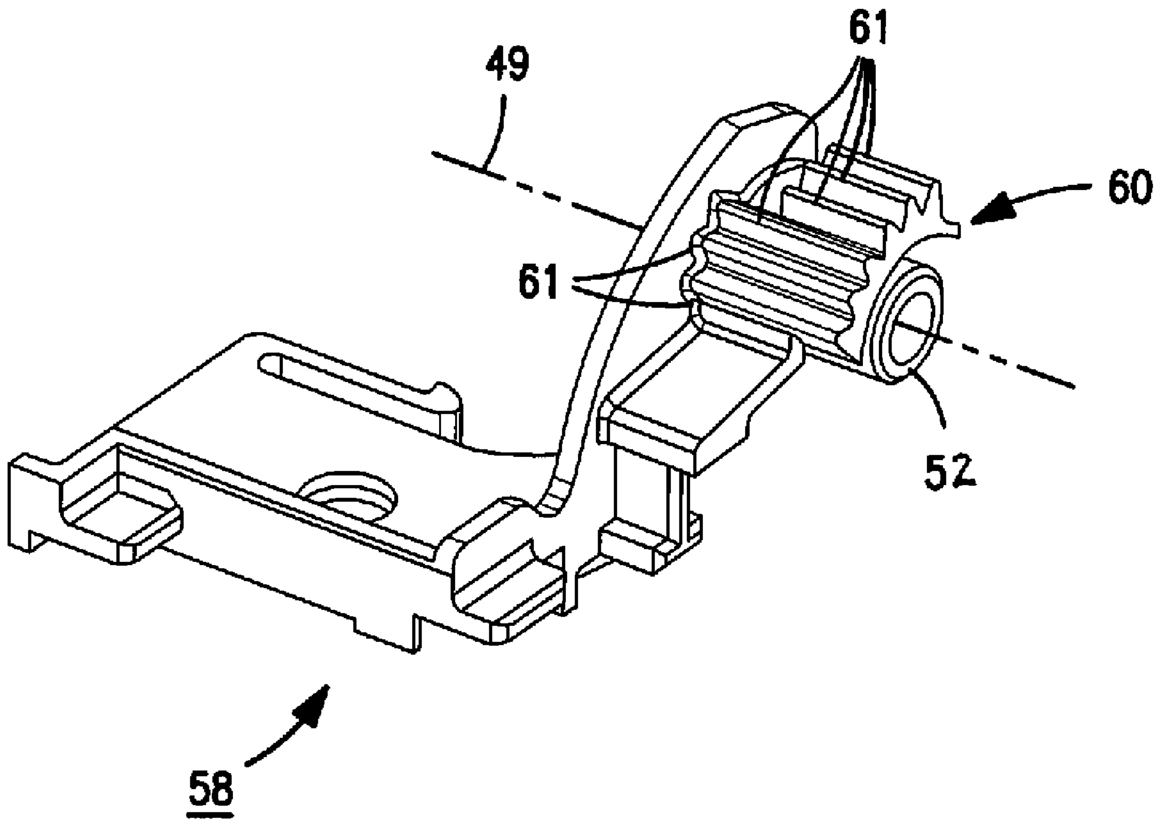
FIG. 7 is a perspective view showing the configuration of a shaft member.

FIG. 7 is a perspective view showing shaft member 58 from the side from which shaft 52 projects. As shown in FIG. 7, a locking member 60 is formed integrally with shaft member 58. Locking member 60 has a plurality of locking claws 61 arranged in the circumferential direction around shaft axis 49. Locking claws 61 are wedge-shaped and protrude outward in a radial direction to shaft axis 49; six (6) locking claws 61 are formed in a radially successive form in the circumferential direction around shaft axis 49. The six (6), successive locking claws 61 form five (5) wedge-shaped spaces there between adjacent locking claws 61. The standing position of liquid crystal display portion 41 is determined by means of these five (5) wedge-shaped spaces, as described below. The number of locking claws 61 is not particularly limited, and may be appropriately increased or decreased for the number of stepwise standing positions of liquid crystal display portion 41.

As shown in FIG. 5, a plate spring 62 is fixed to lower cover 43 of liquid crystal display portion 41 with a screw 63 or other fastener. A wedge-shaped tip portion 64 of plate spring 62 is fixed, projecting in a direction proximate to shaft bearing 50. When shaft 52 of shaft member 58 is secured to shaft bearing 50, tip portion 64 of plate spring 62 compresses against locking member 60.

Figure 8:
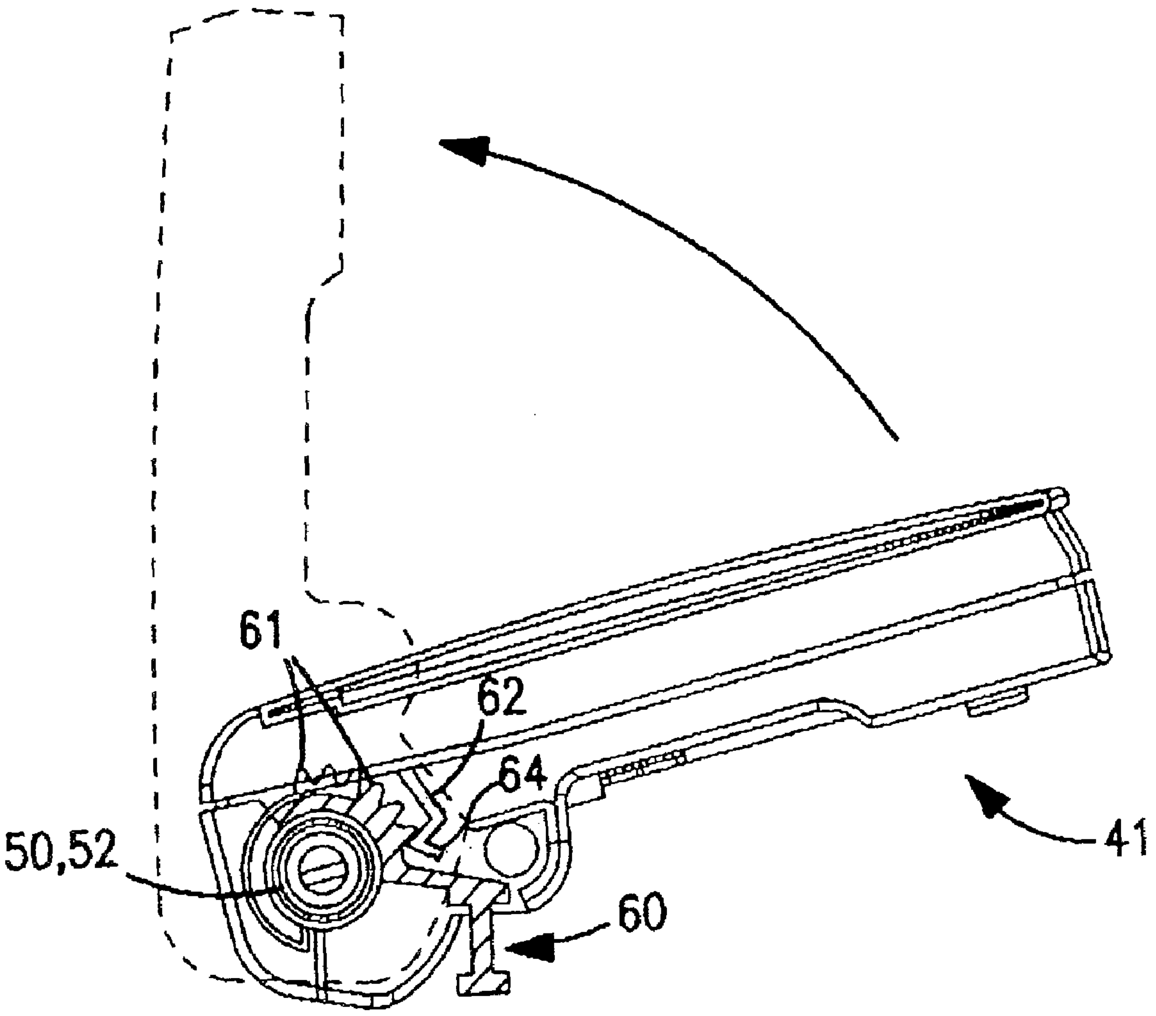
FIG. 8 is a cross-sectional view showing the locking of locking claws by a locking member along line VI-VI of FIG. 6.

FIG. 8 shows locking member 60 and plate spring 62 in a locked state. Locking claws 61 are arranged in a circumferential direction around shaft 52 when the shaft 52 is secured by shaft bearing 50 of liquid crystal display portion 41. Plate spring 62 projecting from the vicinity of shaft bearing 50 of liquid crystal display portion 41 presses against locking member 60, such that wedged-shaped tip portion 64 engages a wedge-shaped space between adjacent locking claws 61.

As shown in FIG. 8, when liquid crystal display portion 41 is in a retracted position, tip portion 64 of plate spring 62 does not engage any of the five (5) wedge-shaped spaces formed by six (6), adjacent locking claws 61. As liquid crystal display portion 41 is rotated from the retracted position in the direction of a standing position, tip portion 64 of plate spring 62 elastically deforms from the tips of locking claws 61 toward the outer radial direction of shaft 52. In other words, a force for elastically deforming plate spring 62 in this manner is applied to liquid crystal display portion 41 in order for liquid crystal display portion 41 to rotate.

When liquid crystal display portion 41 is rotated from a retracted position to a standing position, tip portion 64 of plate spring 62 elastically deforms along locking claws 61 toward the outer radial direction of shaft 52 due to the rotary force applied to liquid crystal display portion 41. When tip portion 64 of plate spring 62 clears the tip of locking claw 61, tip portion 64 locks in the wedge-shaped space formed between that locking claw 61 and the adjacent locking claw 61 and is restored to its original shape in the inner radial direction of shaft 52. From a condition in which tip portion 64 of plate spring 62 is locked in the wedge-shaped spaces between locking claws 61, tip portion 64 of plate spring 62 is elastically deformed in a radial direction from shaft 52 from the tip of locking claw 61 in order to rotate liquid crystal display portion 41 in either the direction of the standing position or in the direction of the retracted position. In other words, as long as further rotary force is not applied to liquid crystal display portion 41, the position of liquid crystal display portion 41 is maintained with tip portion 64 of plate spring 62 in a locked state in the wedge-shaped spaces between locking claws 61.

When liquid crystal display portion 41 is rotated further, tip portion 64 of plate spring 62 elastically deforms along locking claws 61 toward the outer radial direction of shaft 52, and when tip portion 64 of plate spring 62 clears the tip of a certain locking claw 61, tip portion 64 locks in the wedge-shaped spaces formed between that locking claw 61 and adjacent locking claw 61 and is restored to its original shape in the inner radial direction of shaft 52, as described above. Then, as long as liquid crystal display portion 41 is not rotated further, the position of liquid crystal display portion 41 is maintained with tip portion 64 of plate spring 62 in a locked state in the wedge-shaped space between locking claws 61. Through such an engagement between locking claws 61 and plate spring 62, the position of liquid crystal display portion 41 is maintained at a stepwise rotary position. Then, when the stepwise rotary position is moved, the elastic deformation and restoration of plate spring 62 is carried out in succession, generating a clicking sensation in the rotation of liquid crystal display portion 41.

Operation keys 40A are mounted at the periphery of liquid crystal display portion 41 to base plate 56 attached thereto. As shown in FIG. 5, operation keys 40A include a circuit board 70 constituting panel gate array 27, elastic keys members 71 for contacting the contact points of circuit board 70 when depressed as buttons, a key cover 72 for covering circuit board 70 and elastic keys members 71, so as to expose the top surfaces of elastic keys members 71 as the key tops. Decorative covers 73 are affixed around the key tops of key cover 72. By mounting this to base plate 56, operation keys 40A are disposed at the periphery of liquid crystal display portion 41, as shown in FIG. 1.

Figure 9:
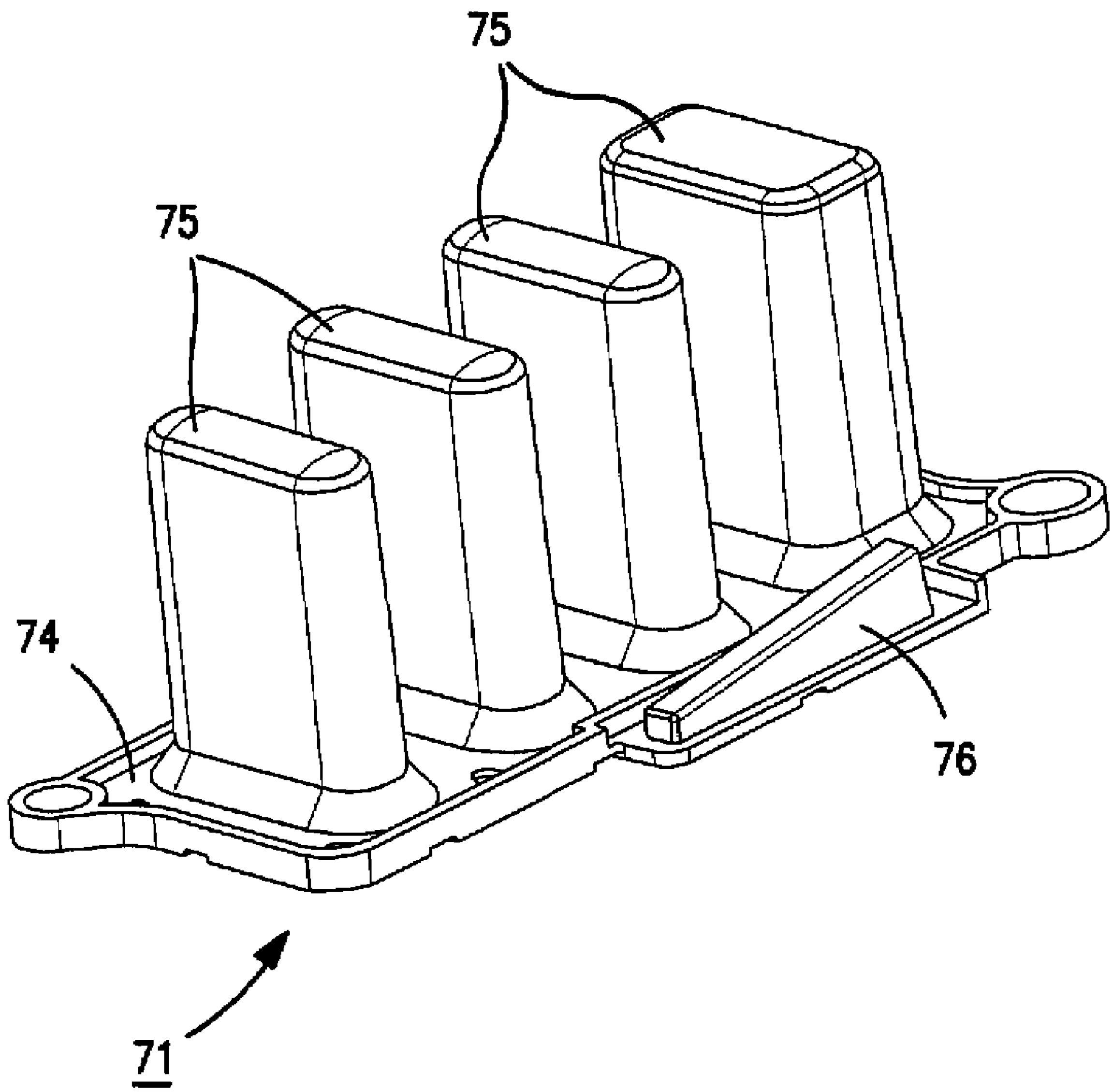
FIG. 9 is a perspective view showing the configuration of elastic key members.

FIG. 9 shows one section of elastic keys members 71. Elastic keys members 71 are made from a deformable material having insulating properties, such as, for example, silicon rubber. As shown in FIG. 1, operation keys 40A are provided at both the left and right sides of liquid crystal display portion 41. As shown in FIG. 5, a left set and a right set of elastic keys members 71 are provided as separate members. FIG. 9 shows the left side elastic keys members 71 in FIG. 5. Because the sets of elastic keys members 71 are substantially, horizontally symmetrical, a description of the other set (the right side of the drawing) of elastic keys members 71 is omitted. Elastic keys members 71 have a flat base portion 74 for contacting circuit board 70; rectangular, columnar key portions 75 protruding upward from base portion 74; and a frictional sliding portion 76 (frictional sliding member) formed at an inside position of the set of elastic keys members 71 at the edge of base plate 74.

As shown in FIG. 5, base portion 74 contacts the top of circuit board 70 at a predetermined position and is fixed to the reverse side of key cover 72 along with circuit board 70. Four (4) of rectangular, columnar key portions 75 are provided in a row, and when the top of one of key top portions 75 is depressed, the periphery of the base of that key portion 75 elastically deforms so as to flex and buckle. A conductive portion provided on the inside of key portion 75 thereby comes into contact with two (2) contact points formed on the top of circuit board 70, creating in the contact points in a conductive state, and the ON/OFF state of each of key portions 75 is electrically recognized in circuit board 70 by means of this conduction.

Frictional sliding portion 76 projects upward from base portion 74 in the lengthwise direction of the row of key portions 75. When elastic keys members 71 are mounted in key cover 72, frictional sliding portion 76 is exposed along a guide groove 78 of key cover 72, and that lengthwise direction becomes perpendicular to shaft axis 49 of liquid crystal display portion 41. Frictional sliding portion 76 is formed, such that the projection height is greater in the direction away from shaft axis 49. In other words, frictional sliding portion 76 is ramp-shaped with the greater height in the direction away from shaft axis 49.

Figure 10:
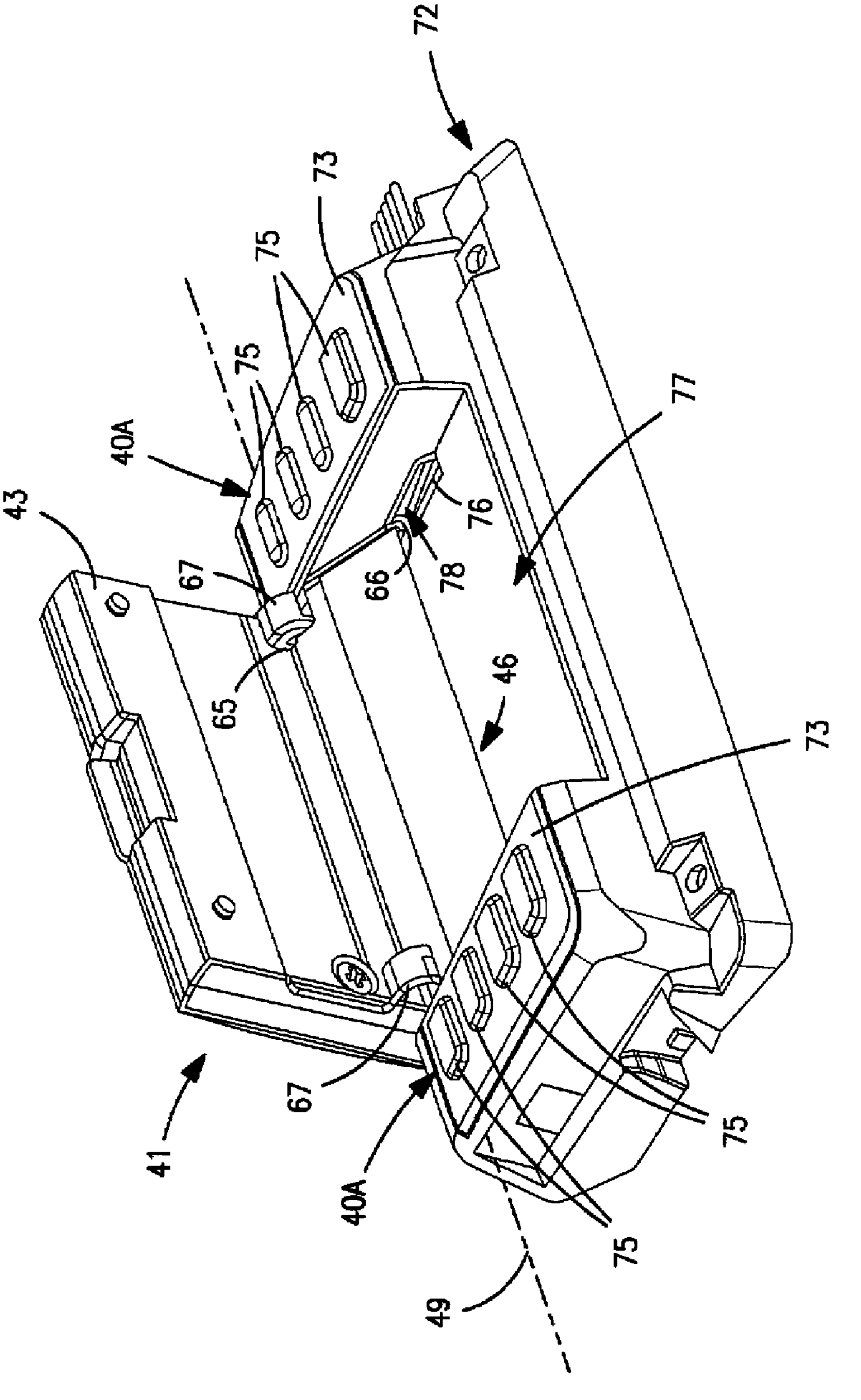
FIG. 10 is a partial perspective view showing the configuration of a rear side of the liquid crystal display portion of FIG. 5.

FIG. 10 is a perspective drawing of the rear side of liquid crystal display portion 41 and operation keys 40A. As shown in the FIG. 10, a recessed portion 77 of key cover 72 is formed centered on the width of key cover 72 to be open upwardly. Recessed portion 77 corresponds to the shape and thickness of liquid crystal display portion 41. When liquid crystal display portion 41 is in a retracted position in relation to key cover 72, liquid crystal display portion 41 is housed within recessed portion 77 so as to form a congruent surface with operation panel 4, as shown in FIG. 1. A portion of each of the opposing sides of recessed portion 77 is notched to form guide groove 78. Guide groove 78 is formed to be elongate in a direction perpendicular to axis 49 of the rotary shaft. Although only one guide groove 78 on the right side of the FIG. 10 recessed is visible, a similar guide groove 78 is formed in the corner portion of recessed portion 77 on the left side of FIG. 10.

As previously described, frictional sliding portion 76 of elastic keys members 71 is exposed to guide groove 78. The groove width of guide groove 78 narrows due to exposure of frictional sliding portion 76 along guide groove 78. Because frictional sliding portion 76 is ramp-shaped with the greater height facing away from shaft axis 49, the groove width of guide groove 78 narrows facing away from shaft axis 49.

Figure 11:
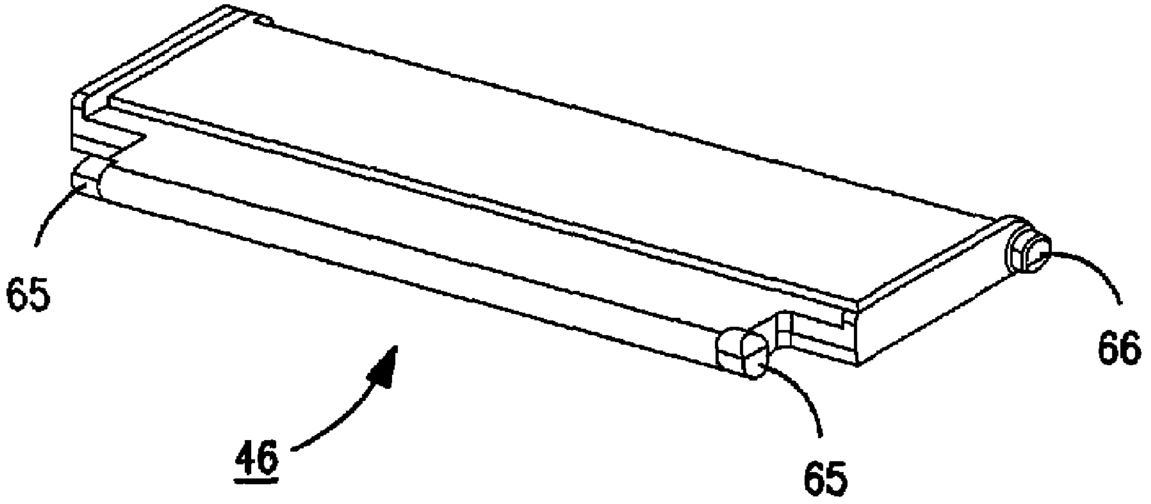
FIG. 11 is a perspective view showing the configuration of a protective cover.

FIG. 11 shows a protective cover 46 (responsive member). Protective cover 46 is plate-shaped with substantially the same width as lower cover 43 of liquid crystal display portion 41. A portion of each end of one side (i.e., the front side in FIG. 11) of protective cover 46 is notched, and support shafts 65 are provided so as to protrude into those notched portions. Each of engagement pieces 66 projects outward on both ends of the other side (i.e., the rear side in FIG. 11) of protective cover 46.

As shown in FIG. 10, protective cover 46 is attached at a rear position of liquid crystal display portion 41. In particular, shaft support portions 67 are formed at rear positions of liquid crystal display portion 41 separated from shaft axis 49 of lower cover 43, and support shafts 65 of protective cover 46 are rotatably attached to shaft support portions 67. Each of engagement pieces 66 of protective cover 46 is engaged securely to guide grooves 78 formed in key cover 72.

Engagement piece 66 is slightly smaller than the groove width of guide groove 78 and slides freely along guide groove 78 when engaged thereto. As previously described, frictional sliding portion 76 of elastic keys member 71 is exposed in guide groove 78. Because the groove width of guide groove 78 is narrowed by frictional sliding portion 76, engagement piece 66 elastically deforms compressing against frictional sliding portion 76. When engagement piece 66 slides along guide groove 78, this compression causes a constant resistance to be generated.

Protective cover 46 attached at a rear position of liquid crystal display portion 41 covers the vicinity of shaft axis 49 of the rear of liquid crystal display portion 41. As shown in FIG. 5, flat cable 54 for electrically connecting LCD module 44 and the control board provided at the main body side of multi-function device 1 extends from liquid crystal display portion 41, and a notch 79 for inserting flat cable 54 is formed in key cover 72. Because circuit board 70 is disposed behind key cover 72, infiltration of metallic, foreign materials, such as paper clips, from notch 79 into key cover 72 and contact between such foreign materials and circuit board 70 are undesirable because they could cause electrical failure. Because notch 79 is covered by protective cover 46, intrusion by foreign materials into key cover 72 is prevented.

Figure 12:
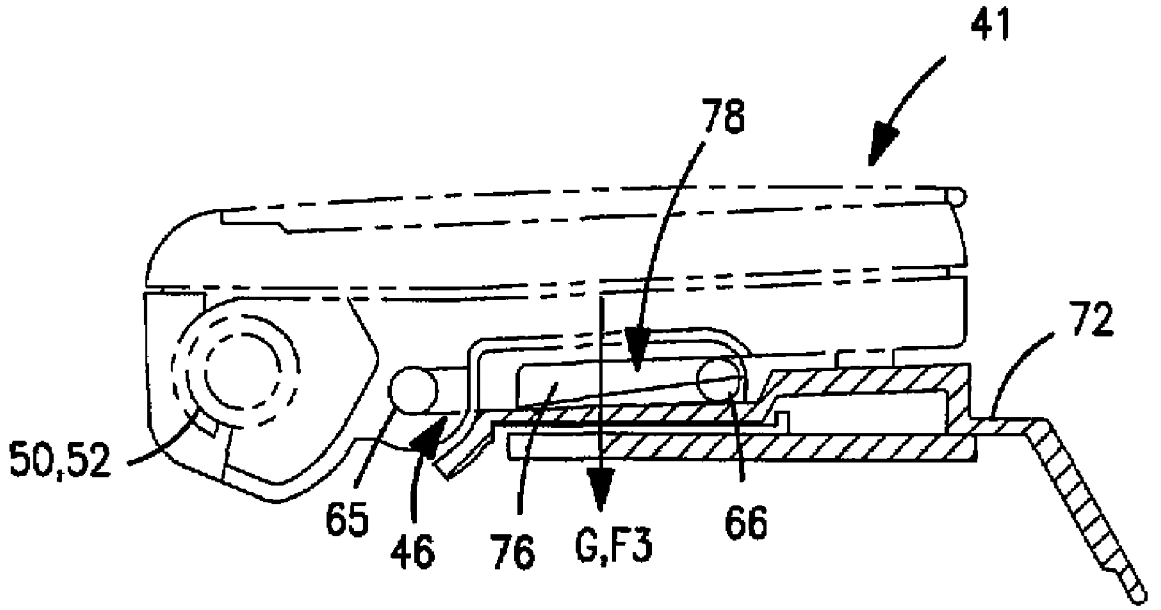
FIG. 12 is a schematic view showing the liquid crystal display portion in a retracted position.
Figure 13:
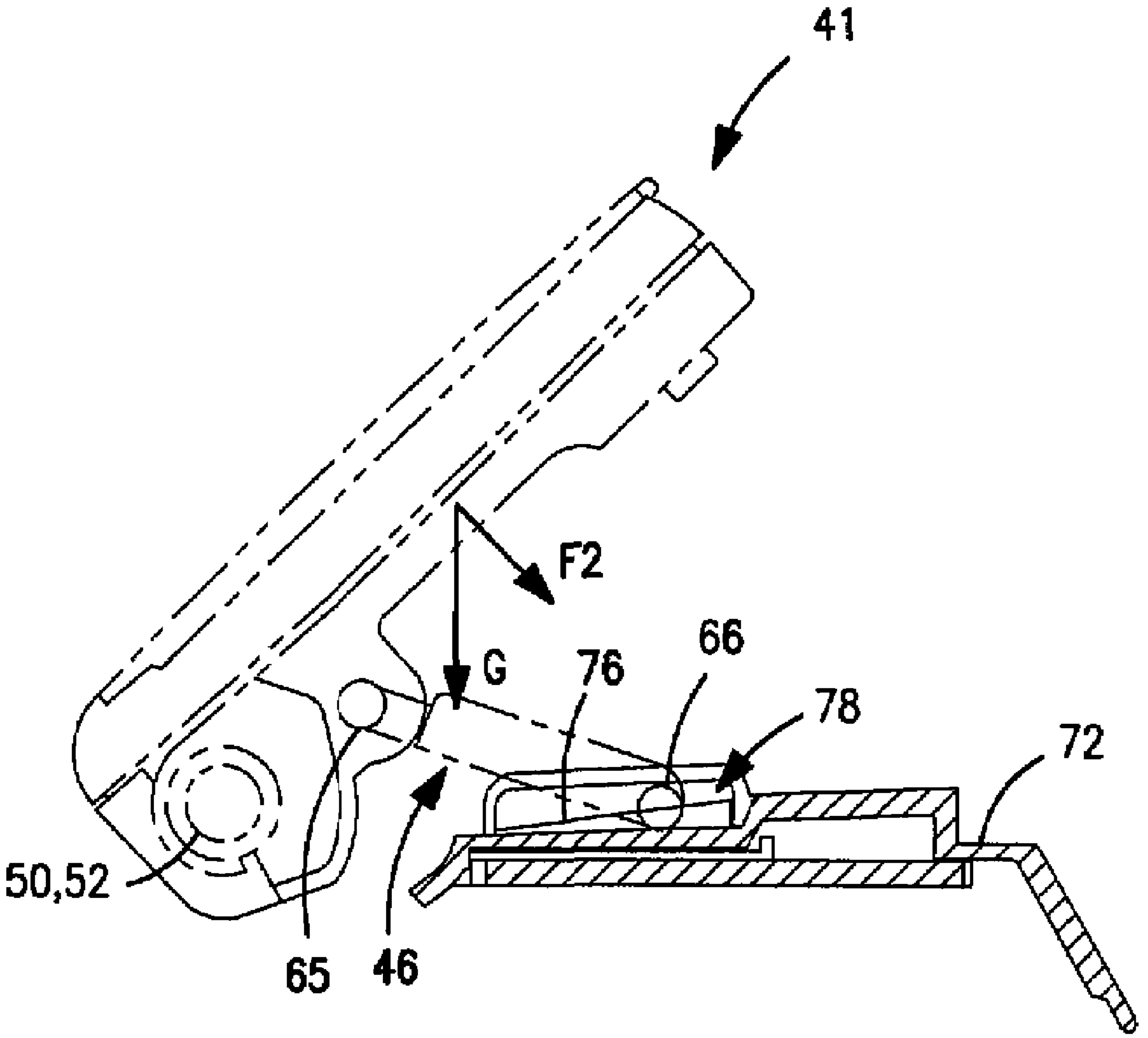
FIG. 13 is a schematic view showing the liquid crystal display portion at an intermediate position.
Figure 14:
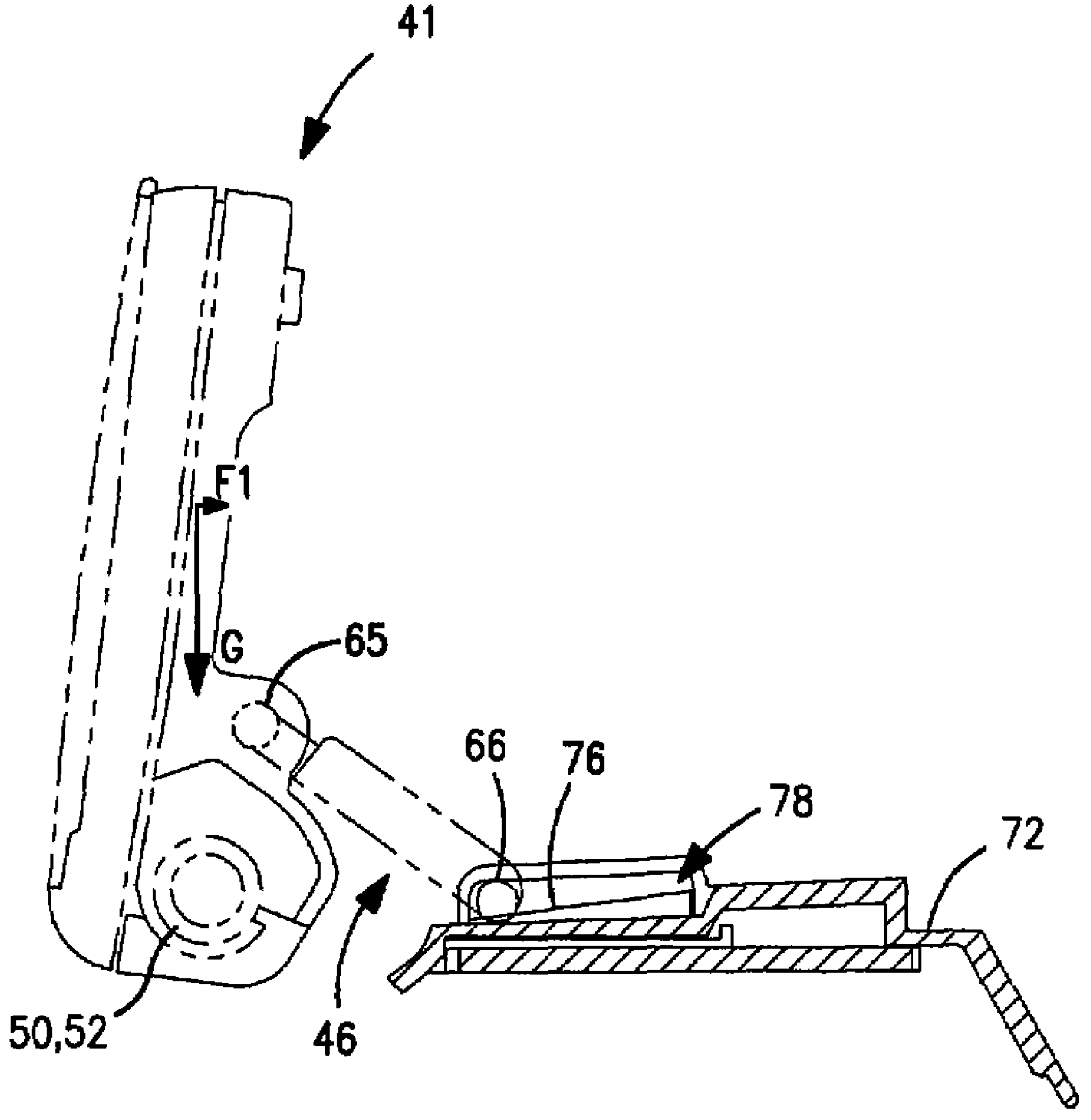
FIG. 14 is a schematic view showing the liquid crystal display portion in a standing position.

Extension of liquid crystal display portion 41 and reciprocation of protective cover 46 are described below. FIG. 12 shows liquid crystal display portion 41 in a retracted position, FIG. 13 shows liquid crystal display portion 41 in an intermediate position during extension, and FIG. 14 shows liquid crystal display portion 41 in a standing position. For convenience of the depiction, portions of elastic keys members 71 and key cover 72 have been omitted from the drawings.

Liquid crystal display portion 41 is rotatable centered on shaft axis 49 of the rotary shaft formed by shaft bearing 50 and shafts 51, 52, and extends in relation to key cover 72 constituting one portion of the device main body. Shaft 65 of protective cover 46 is supported at the rear of liquid crystal display portion 41 and rotates with the rotation of liquid crystal display portion 41. When display portion 41 is housed in recessed portion 77 of key cover 72, protective cover 46 is also housed in recessed portion 77 in parallel with a rear surface of display portion 41. Accompanying the rotation of protective cover 46, engagement piece 66 reciprocates in guide groove 78. In other words, the rotation of support shaft 65 is transmitted by the reciprocation of engagement piece 66.

Frictional sliding portion 76 is exposed in guide groove 78, and the groove width of guide groove 78 narrows. Engagement piece 66, fit into guide groove 78, compresses frictional sliding member 76 and elastically deforms frictional sliding member 76. Frictional sliding member 76 has the resiliency to elastically restore this deformation, and a frictional force greater than the frictional force of simple contact without engagement piece 66 elastically deforming frictional sliding member 76 is generated during the sliding of engagement piece 66 due to this elastic restorative force. Frictional resistance is generated during the reciprocation of engagement piece 66 of protective cover 46 due to this frictional force. Because the reciprocation of engagement piece 66 of protective cover 46 results from the rotation of liquid crystal display portion 41, the frictional resistance also is applied to the rotation of liquid crystal display portion 41, and friction is generated by the rotation of liquid crystal display portion 41. Accordingly, it may be necessary to apply a force greater than the friction (e.g., frictional resistance) in order to rotate and change the position of liquid crystal display portion 41 from any of the positions shown in FIGS. 12-14, and as long as such a force is not applied, liquid crystal display portion 41 maintains its position without rotating due to its own weight. In this manner, the tilt mechanism for maintaining liquid crystal display portion 41 at a desired position is implemented.

As shown in FIGS. 12-14, as liquid crystal display portion 41 retracts, engagement piece 66 of protective cover 46 slides along guide groove 78 in a direction (e.g., toward the left side of FIG. 12) away from shaft axis 49 (the shaft bearing 50 and the shaft 52). As shown in FIG. 14, when liquid crystal display portion 41 is in a standing position, a component force F1 in the direction of rotation of liquid crystal display portion 41, which force is due to a weight G of liquid crystal display portion 41, is relatively small. As shown in FIG. 13, when liquid crystal display portion 41 is partially retracted from a standing position, a component force F2 in the direction of rotation of liquid crystal display portion 41 due to the weight G of liquid crystal display portion 41 is greater than component force F1. As shown in FIG. 1214, when liquid crystal display portion 41 is in a substantially horizontal, retracted position, much of the weight G of liquid crystal display portion 41 becomes a component force F3 in the direction of rotation. In other words, as liquid crystal display portion 41 retracts, rotation in the direction of retraction due to the weight G of the liquid crystal display portion 41 readily occurs, so that a significant amount of friction is necessary to maintain liquid crystal display portion 41 at a desired position.

Because frictional sliding portion 76 exposed in guide groove 78 is ramp-shaped so as to make the groove width of guide groove 78 narrow toward the direction in which protective cover 46 moves as liquid crystal display portion 41 retracts, engagement piece 66 elastically deforms frictional sliding portion 76 to a significant degree due to the rotation of liquid crystal display portion 41 in the direction of retraction. As engagement piece 66 slides in guide groove 78 in the direction of retraction of liquid crystal display portion 41, frictional force generated due to the frictional sliding portion 76, continuously increases. Thus, friction may be generated for maintaining liquid crystal display portion 41 in a desired position even if liquid crystal display portion 41 is at a position approaching the retracted position. In addition, as liquid crystal display portion 41 retracts, the friction generated in liquid crystal display portion 41 remains constant over the rotational range, thereby improving the operational feel.

As shown in FIG. 8, as liquid crystal display portion 41 is rotated, tip portion 64 of plate spring 62 moves along locking claws 61 of locking member 60. In that process, as tip portion 64 of plate spring 62 moves from between the currently locked locking claws 61 to between next locking claws 61, tip portion 64 elastically deforms as it traverses locking claws 61 and is restored to its original shape between the currently locked locking claws 61 and next locking claws 61. As liquid crystal display portion 41 continues to rotate, the elastic deformation and restoration of plate spring 62 occurs in succession, and a clicking sensation is produced in the rotation of liquid crystal display portion 41 each time tip portion 64 of plate spring 62 locks between locking claws 61.

When plate spring 62 is restored after elastic deformation, the elastic deformation convergently settles, such that plate spring 62 vibrates. These vibrations of plate spring 62 are transmitted to liquid crystal display portion 41 as minute movements in the direction of rotation. Accompanying this, minute movements in the direction of rotation also are transmitted to protective cover 46. Although engagement piece 66 attempts to reciprocate so as to vibrate, e.g., slide, in guide groove 78, minute movements of protective cover 46 are reduced or eliminated because frictional resistance from frictional sliding portion 76 is applied against the sliding of engagement piece 66. Minute rotations of liquid crystal display portion 41 also thereby are reduced or eliminated, and a desirable clicking sensation from the elastic deformation and restoration of plate spring 62 is implemented without minute vibrations.

Protective cover 46 rotatably attached on the rear side of liquid crystal display portion 41 rotates along with liquid crystal display portion 41. Because engagement piece 66 provided on protective cover 46 is made to slide while compressed against frictional sliding portion 76 engaged in guide groove 78 of key cover 72, a frictional force is generated in the sliding of engagement piece 66, the frictional resistance is applied to the reciprocation of protective cover 46 by this frictional force, and the tilt mechanism for maintaining liquid crystal display portion 41 in a desired position is thereby achieved. Because this tilt mechanism is achieved using the frictional force between frictional sliding portion 76 and engagement piece 66 in a location removed from shaft bearing 50 and shafts 51, 52 forming shaft axis 49 of the rotary shaft of liquid crystal display portion 41, the configuration proximate to shaft axis 49 of liquid crystal display portion 41 is simple, and the periphery of liquid crystal display portion 41 may be made thinner. In addition, by applying the frictional force to the sliding of engagement piece 66 at a position removed from shaft axis 49 of the rotary shaft of liquid crystal display portion 41, the frictional force for achieving the tilt mechanism may be reduced, and abrasion and noise of frictional sliding portion 76 may be reduced or eliminated.

Further, because frictional sliding portion 76 may be realized at a reduced cost by forming frictional sliding portion 76 integrally with elastic keys members 71, and because frictional sliding portion 76 may be attached to key cover 72 along with elastic keys members 71, the number of components may be reduced, and the man-hours required for assembly may be reduced, thereby decreasing the manufacturing costs. In addition, even if dust or other foreign materials infiltrate the inside of key cover 72 from guide groove 78, the foreign materials are stopped at base portion 74 of elastic keys members 71 and are prevented from dropping onto circuit board 70. The occurrence of electrical failures in circuit board 70 is thereby reduced or eliminated.

Although responsive member according to the present invention achieved as protective cover 46 in this embodiment, it is apparent that the responsive member is not limited to protective cover 46, that is, of having the effect of preventing foreign materials from infiltrating through notch 79 of key cover 72. Accordingly, in addition to the plate-shaped protective cover 46, the responsive member according to the present invention also may be implemented as, for example, independent left and right arm-shaped members or the like.

While the invention has been described in connection with various embodiments, it will be understood by those skilled in the art that variations and modifications of the embodiments described above may be made without departing from the scope of the invention. Other embodiments will be apparent to those skilled in the art from a consideration of the specification or from a practice of the invention disclosed herein. It is intended that the specification and the described examples are considered exemplary only, with the true scope of the invention indicated by the following claims.

What is claimed is:

1. An electronic apparatus comprising:

a main body;

a display portion supported by the main body rotatably about an axis of a rotary shaft so as to extend and retract with respect to the main body;

a responsive member that reciprocates in a guide groove formed in the main body as a result of the extension and retraction of the display portion, the responsive member comprising a first end rotatably attached to a rear side of the display portion at a position offset from the axis of the rotary shaft, and a second end comprising an engagement piece engaged with the guide groove; and a frictional sliding member disposed along the guide groove and, when compressed by the engagement piece of the responsive member, applying a frictional force to the reciprocating responsive member.

2. The electronic apparatus as described in claim 1, further comprising:

a locking member provided at the main body and having a plurality of locking claws arrayed in a circumferential direction around the axis of the rotary shaft, and an elastic member provided protruding from the display portion and comprising a tip bent to be locked between adjacent locking claws so as to compress against the locking member, wherein the display portion is maintained at a desired position when the tip of the elastic member is locked between the locking claws of the locking member.

3. The electronic apparatus as described in claim 1, further comprising an operation key disposed adjacent to the guide groove for inputting a desired instruction, wherein an elastic key member comprising the operation key and the frictional sliding member are formed integrally.

4. The electronic apparatus as described in claim 1, wherein the frictional sliding member is formed from an elastic deformable material compressed against the engagement piece.

5. The electronic apparatus as described in claim 1, wherein the frictional sliding member increases a compression force applied to the engagement piece as the responsive member moves along with the retraction of the display portion.

6. The electronic apparatus as described in claim 5, wherein the frictional sliding member narrows the width of the guide groove toward a direction in which the responsive member moves as the display portion retracts.

7. The electronic apparatus as described in claim 6, wherein the engagement piece of the responsive member slides in the guide groove in a direction away from the axis of the rotary shaft as the display portion retracts.

8. The electronic apparatus as described in claim 1, wherein the axis of the rotary shaft extends horizontally, and the display portion extends to face toward a front side of the main body and retracts to face upward.

9. The electronic apparatus as described in claim 1, wherein the axis of the rotary shaft is formed by a shaft provided at one of the main body and the display portion, and a shaft support provided at the other of the main body and the display portion.

10. The electronic apparatus as described in claim 1, wherein the responsive member has, at the first end thereof, one of a shaft and a shaft support, and the display portion has, at the rear side thereof at the position offset from the axis of the rotary shaft, the other of the shaft and the shaft support.

11. The electronic apparatus as described in claim 1, wherein the frictional sliding member is elongate in a direction perpendicular to the axis of the rotary shaft and has a height that gradually increases in a direction away from the axis of the rotary shaft.

12. The electronic apparatus as described in claim 1, wherein the guide groove is elongate in a direction perpendicular to the axis of the rotary shaft and has a groove width that is slightly larger than the engagement piece.

13. The electronic apparatus as described in claim 1, wherein a recessed portion is provided on the main body to be open upwardly, and the display portion is retractable into the recessed portion.

14. The electronic apparatus as described in claim 13, wherein the responsive member has a flat plate shape, and when the display portion is housed in the recessed portion, the responsive member is housed in the recessed portion in parallel with a rear surface of the display portion.

15. The electronic apparatus as described in claim 13, further comprising:

operation keys provided on the main body for inputting a desired instruction, and a key cover attached to the main body so as to cover the operation keys, wherein the recessed portion is formed in the key cover.

16. The electronic apparatus as described in claim 15, wherein the guide groove is formed at a side wall of the recessed portion, and the frictional sliding member is disposed between the operation keys and the recessed portion and is covered by the key cover to be exposed through the guide groove.

17. The electronic apparatus as described in claim 16, wherein the operation keys and the frictional sliding member are formed integrally from an elastic material.

18. An image forming apparatus comprising:

a printer; and an electronic apparatus comprising:

a main body;

a display portion supported by the main body rotatably about an axis of a rotary shaft so as to extend and retract with respect to the main body;

a responsive member that reciprocates in a guide groove formed in the main body as a result of the extension and retraction of the display portion, the responsive member comprising a first end rotatably attached to a rear side of the display portion at a position offset from the axis of the rotary shaft, and a second end comprising an engagement piece engaged with the guide groove; and a frictional sliding member disposed along the guide groove and, when compressed by the engagement piece of the responsive member, applying a frictional force to the reciprocating responsive member.

19. The image forming apparatus of claim 18, further comprising an operation key disposed adjacent to the guide groove for inputting a desired instruction, wherein an elastic key member comprising the operation key and the frictional sliding member are formed integrally.

20. The image forming apparatus of claim 18, further comprising a slot portion configured to receive a storage media and to extract image data from the storage media.

* * * * *